United States Patent [19]
Itou

[11] Patent Number: 6,026,104
[45] Date of Patent: Feb. 15, 2000

[54] APPARATUS FOR CONTROLLING LASER DIODE

[75] Inventor: Tohru Itou, Tokyo, Japan

[73] Assignee: Oki Electric Industry Co., Ltd., Tokyo, Japan

[21] Appl. No.: 09/034,290

[22] Filed: Mar. 4, 1998

[30] Foreign Application Priority Data

Apr. 24, 1997 [JP] Japan ..................... 9-107278

[51] Int. Cl.[7] ....................................... H01S 3/00
[52] U.S. Cl. ........................................... 372/38
[58] Field of Search ................................ 372/38

[56] References Cited

U.S. PATENT DOCUMENTS

| | | | |
|---|---|---|---|
| 5,276,671 | 1/1994 | Minami et al. | 372/38 |
| 5,276,697 | 1/1994 | Davis | 372/38 |
| 5,675,599 | 10/1997 | Abe et al. | 372/38 |
| 5,706,116 | 1/1998 | Sugata | 372/38 |
| 5,736,844 | 4/1998 | YanagIawaw | 372/38 |
| 5,793,786 | 8/1998 | Furumiya | 372/38 |
| 5,933,441 | 8/1999 | Chen | 372/38 |

*Primary Examiner*—Leon Scott, Jr.
*Attorney, Agent, or Firm*—Wenderoth, Lind & Ponack, L.L.P.

[57] ABSTRACT

An apparatus for controlling a laser diode (135) includes a photodiode (136) which monitors an output light ($P_{pump}$) of the laser diode (135) and a control signal generator (132) which generates a control signal in response to an output of the photodiode (136). The apparatus also includes a driver circuit (134) which drives the laser diode (135) in response to the control signal so that the laser diode (135) generates a constant power of light.

24 Claims, 10 Drawing Sheets

6,026,104

APPARATUS FOR CONTROLLING LASER DIODE

CROSS REFERENCE TO RELATED APPLICATION

This application claims the priority of Application No. H09-107278, filed Apr. 24, 1997 in Japan, the subject matter of which is incorporated herein by reference.

TECHNICAL FIELD OF THE INVENTION

The present invention relates to an apparatus for controlling an output power of a laser diode, and more particularly, to such an apparatus used in an optical amplifier.

BACKGROUND OF THE INVENTION

A type of optical amplifier includes an EDFA (Erbium Doped Fiber optic Amplifier), which amplifies an input signal light to provide an output signal light having a constant power. The EDFA is excited with an excitation light generated by a laser diode, and the like. The input signal light is combined with the excitation light, and the combination light is supplied to the EDFA.

In such an optical amplifier, it is important to control an output power of the laser diode in order to keep the output signal light being constant. For controlling the laser diode, it is required to detect electric current flowing through it precisely. According to a conventional technology, a resistor is serially connected to a transistor, which drives the laser diode, to detect the electric current flowing through the laser diode. However, some voltage is lost at the resistor; and therefore, it is difficult to drive the laser diode with small quantity of electric current.

OBJECTS OF THE INVENTION

Accordingly, an object of the invention is to provide an apparatus that can control a laser diode without losing large amount of power.

Another object of the invention is to provide a laser module, in which a laser diode is controlled without losing large amount of power.

Still another object of the invention is to provide an optical amplifier, in which a laser diode, generating an exciting light, is controlled without losing large amount of power.

Additional objects, advantages and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the invention, an apparatus for controlling a laser diode (135) includes a photodiode (136) which monitors an output light of the laser diode (135); a control signal generator (132) which generates a control signal in response to an output of the photodiode (136); and a driver circuit (134) which drives the laser diode (135) in response to the control signal so that the laser diode (135) generates an optimum power of light.

According to a second aspect of the invention, a laser module includes a laser diode (135) which generates a light ($P_{pump}$); a photodiode (136) which monitors the light ($P_{pump}$) supplied from the laser diode (135); and a control signal generator (132) which generates a control signal in response to an output of the photodiode (136). The laser diode (135) is controlled in response to the control signal to generate an optimum power of light.

According to a third aspect of the invention, an apparatus for amplifying a signal light includes an optical amplifier (3) which amplifies an input light ($P_{sig-in}$) to generate an output light ($P_{sig-out}$); a laser diode (135) which generates an excitation light ($P_{pump}$) to be combined with the input light ($P_{sig-in}$) to excite the optical amplifier (3); a first photodiode (136) which monitors the excitation light ($P_{pump}$) supplied from the laser diode (135); a control signal generator (132) which generates a control signal in response to an output of the photodiode (136); and a driver circuit (134) which drives the laser diode (135) in response to the control signal so that the laser diode (135) generates an optimum power of excitation light ($P_{pump}$).

DETAILED DISCLOSURE OF THE INVENTION

Figure 1:
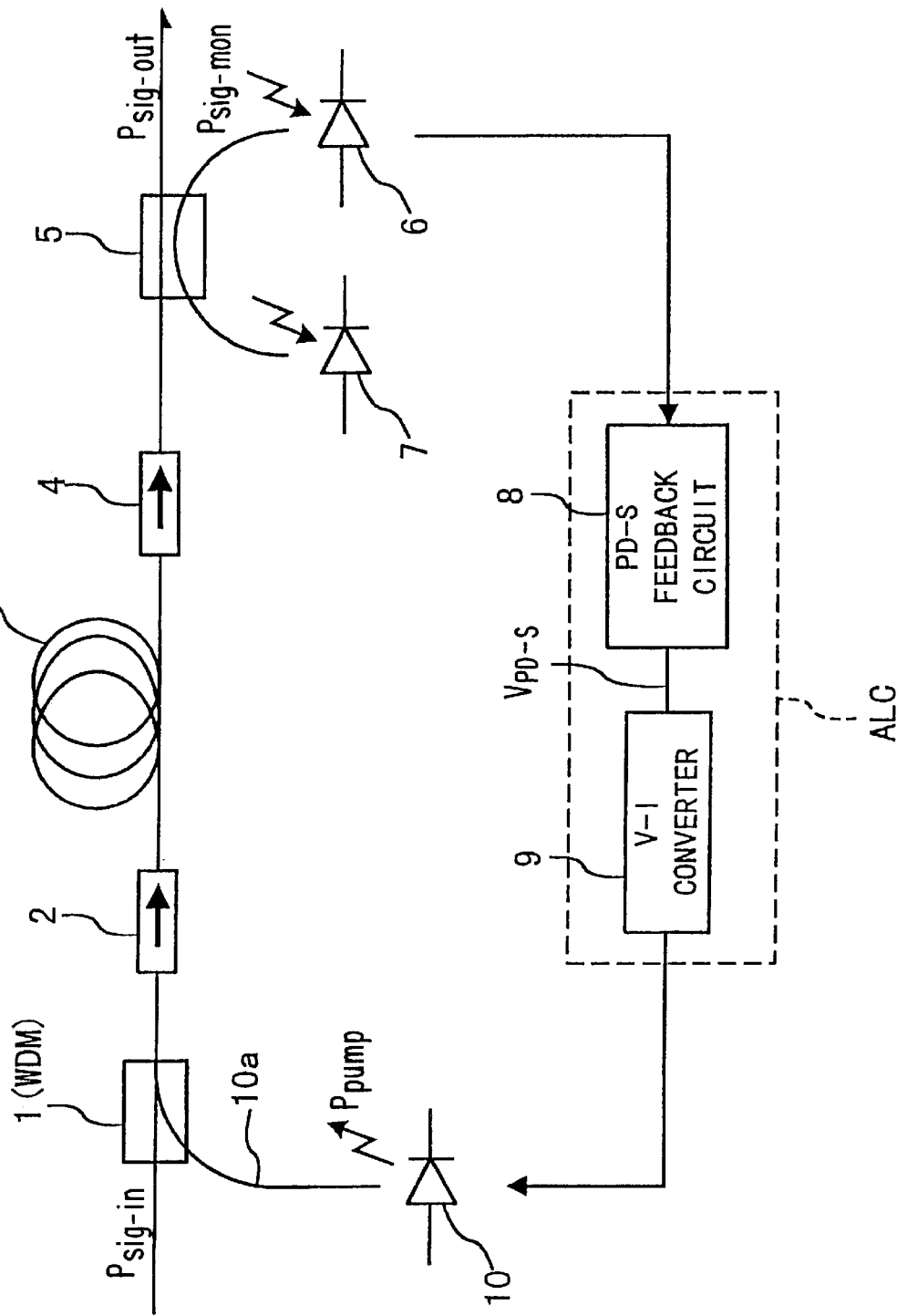
FIG. 1 is a conceptual diagram illustrating an optical amplifier to which the invention is applied.

For better understanding of the invention, background technology is first described in conjunction with FIG. 1. FIG. 1 shows an apparatus for amplifying an input signal light $P_{sig-in}$ to provide an output signal light $P_{sig-out}$ having a constant power. The apparatus includes a WDM (Wavelength Division Multiplexer) 1 to which the input signal light $P_{sig-in}$ is supplied. The WDM 1 is connected at an output terminal to an input terminal of an isolator 2, of which an output terminal is connected to an input terminal of an EDFA (Erbium Doped Fiber optic Amplifier) 3.

The EDFA amplifies the input signal light $P_{sig-in}$ to provide the output signal light $P_{sig-out}$. The EDFA 3 is connected at an output terminal to an input terminal of another isolator 4, of which an output terminal is connected to an input terminal of a photo coupler 5. The photo coupler 5 divides a signal supplied from the isolator 4 into two to provide the output signal light $P_{sig-out}$ and a monitor signal light $P_{sig-mon}$ to be supplied to a photodiode 6. The photo coupler 5 is also coupled to a photodiode 7. The photodiode 6 converts the monitor signal light $P_{sig-mon}$ into electric current in order to detect the power of the output signal light $P_{sig-out}$.

The photodiode 6 is connected at an output terminal to an input terminal of a PD-S feedback circuit 8. In response to an output signal of the photodiode 6, the PD-S feedback circuit 8 generates a control voltage $V_{PD-S}$. The PD-S feedback circuit 8 is connected at an output terminal to an input terminal of a V-I converter 9, which drives a laser diode 10. The PD-S feedback circuit 8 and the V-I converter 9 compose an ALC (Automatic Level Control), which feedback-controls the output signal light $P_{sig-out}$ to be constant.

The laser diode 10 generates an excitation light $P_{pump}$ to be supplied through an optical fiber 10a to the WDM 1. The excitation light $P_{pump}$ is combined with the input signal light $P_{sig-in}$ at the WDM 1 so that the EDFA 3 is excited.

Figure 2:
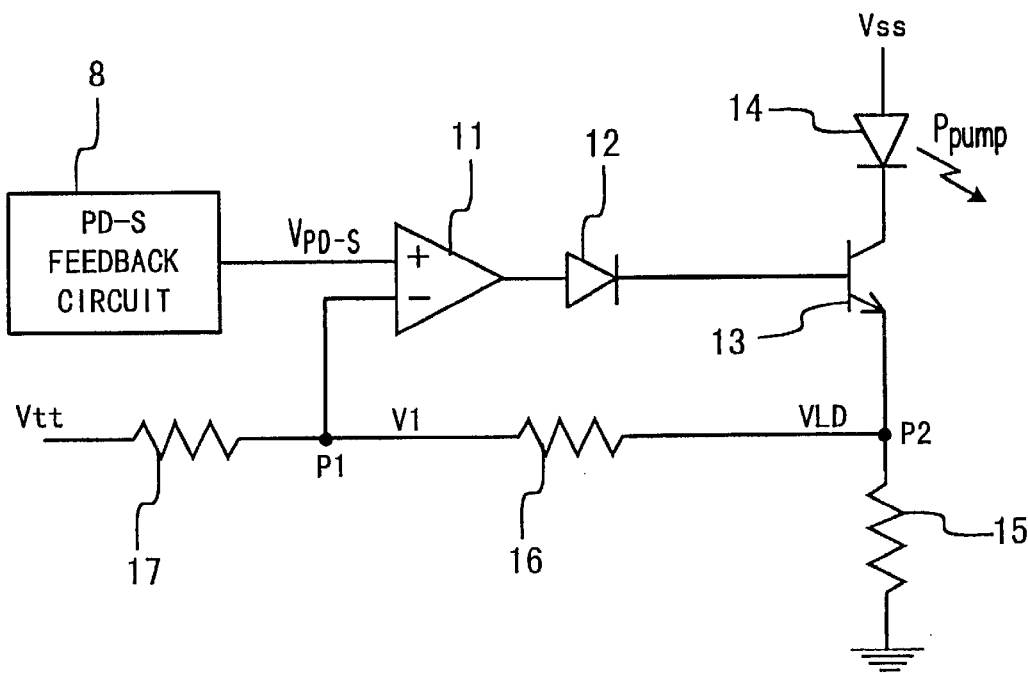
FIG. 2 is a circuit diagram illustrating a conventional V-I converter used for controlling a laser diode in an optical amplifier.

FIG. 2 shows the V-I converter 9, according to a conventional technology. The conventional V-I converter includes an operational amplifier 11, connected at a positive input terminal to the output terminal of the PD-S feedback circuit 8. The operational amplifier 11 is connected at an output terminal to an anode of a diode 12, of which a cathode is connected to a base of an n-p-n type transistor 13. The transistor 13 is connected at a collector to a cathode of a laser diode 14, and at an emitter to an end of a resistor 15, of which the other end is grounded. The transistor 13 is designed to drive the laser diode 14. The laser diode 14 is designed to be used in place of the laser diode 10, shown in FIG. 1. The laser diode 14 is connected at an anode to a power supply Vss. The laser diode 14 may be connected to the power supply Vss through a supply filter (not shown). The resistor 15 is used for detecting electric current flowing through the laser diode 14.

The operational amplifier 11 is connected at a negative input terminal to a connection point P1 between serially-connected resistors 16 and 17. The other end of the resistor 16 is connected to a connection point P2 between the transistor 13 and the resistor 15. The other end of the resistor 17 is applied with a reference voltage Vtt. The voltage at the connection point P2 is to be a monitor voltage VLD. It is assumed that the voltage at the connection point P1 is V1.

In the above described conventional V-I converter, the operational amplifier 11 is controlled, in accordance with the voltage $V_{PD-S}$ from the PD-S feedback circuit 8 and the voltage V1, to generate an optimum quantity of current signal, which is to be supplied to the base of the transistor 13. In response to the current signal from the operational amplifier 11, the transistor 13 drives the laser diode 14. At this time, the monitor voltage VLD is detected and the voltage V1 is supplied to the operational amplifier 11, so that the laser diode 14 is controlled to generate a constant output light (excitation light $P_{pump}$).

According to the above mentioned conventional V-I converter, voltage loss occurs at the resistor 15; and therefore, it is difficult to drive the laser diode 14 (10) with low power consumption. In order to drive the laser diode 14 with 600 mA of current, for example, the forward current $V_f$ of the laser diode 14 is 2.2V, the base-emitter voltage $V_{be}$ of the transistor 13 is 0.8V, and the terminal-to-terminal voltage of the resistor 15 is 0.3V (if the resistance is 0.5Ω). Accordingly, 3.3V power is required in total. If a 3.3V power supply is employed, the minimum voltage would be 3.135V in consideration of voltage variation of ±5%. It means that the laser diode 14 can not always be driven.

Figure 3:
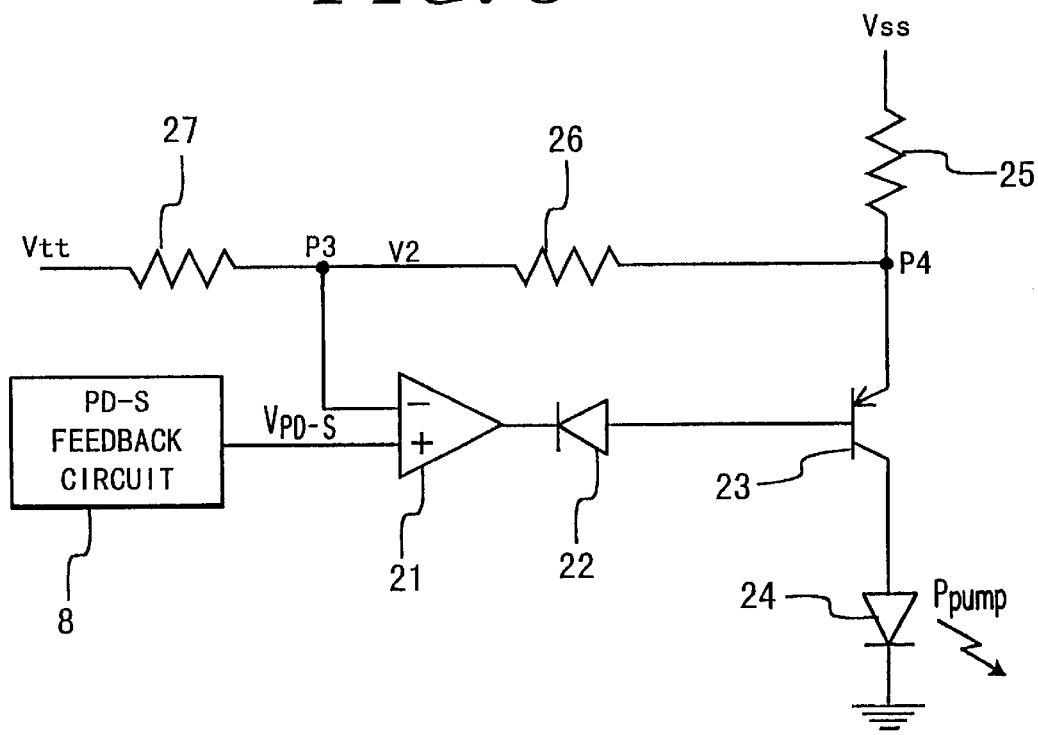
FIG. 3 is a circuit diagram illustrating another conventional V-I converter used for controlling a laser diode in an optical amplifier.

FIG. 3 shows another type of conventional V-I converter, which includes an operational amplifier 21 connected at a positive input terminal to the output terminal of the PD-S feedback circuit 8 (FIG. 1). The operational amplifier 21 is connected at an output terminal to a cathode of a diode 22, of which an anode is connected to a base of a p-n-p type transistor 23. The transistor 23 is connected at a collector to an anode of a laser diode 24, which is designed to be used in place of the laser diode 10, shown in FIG. 1.

The laser diode 24 is connected at a cathode to the ground. The transistor 23 is connected at an emitter to one end of a resistor 25, of which the other end is connected to a power supply Vss. The operational amplifier 21 is connected at a negative input terminal to a connection point P3 between serially-connected resistors 26 and 27. The other end of the resistor 27 is applied with a reference voltage Vtt. The other end of the resistor 26 is connected to a connection point P4 between the resistor 25 and the transistor 23.

In the above described V-I converter, the operational amplifier 21 generates a current signal to be supplied to the base of the transistor 23 in accordance with the voltage $V_{PD-S}$ from the PD-S feedback circuit 8 and a voltage V2 at the connection point P3. In response to the current signal from the operational amplifier 21, the transistor 23 drives the laser diode 24. At the same time, the voltage V2 is applied to the operational amplifier 21, so that the laser diode 24 is controlled to generate a constant output light (excitation light $P_{pump}$).

According to the conventional V-I converter, shown in FIG. 3, however, the voltage V2 is changed in level in response to variation of the power supply Vss. Therefore, it is difficult to detect the current flowing through the laser diode 24 (10).

Now, preferred embodiments of the invention are described in conjunction with FIGS. 4 to 13.

Figure 4:
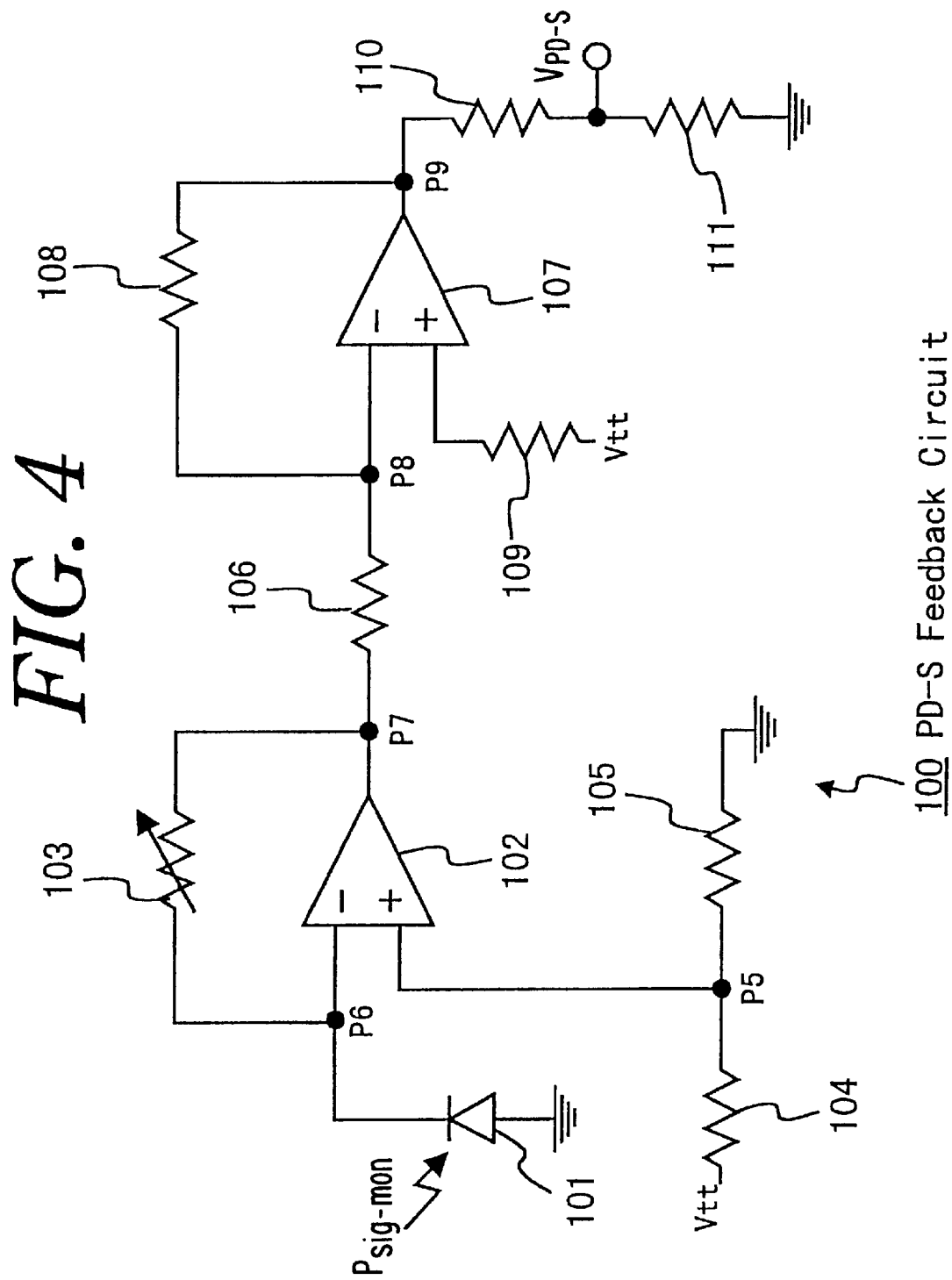
FIG. 4 is a circuit diagram illustrating a PD-S feedback circuit used in an optical amplifier according to a first preferred embodiment of the invention.

FIG. 4 shows a PD-S feedback circuit 100 used in an optical amplifier, according to a first preferred embodiment of the invention. The PD-S feedback circuit 100 is designed to be used in place of the above mentioned PD-S feedback circuit 8, shown in FIG. 1. The PD-S feedback circuit 100 includes an operational amplifier 102, connected at an negative input terminal to a cathode of a photodiode 101. The photodiode 101 is designed to be used in place of the photodiode 6, shown in FIG. 1, monitoring the output signal light $P_{sig-out}$.

The photodiode 101 is connected at an anode to the ground. The operational amplifier 102 is connected at a positive input terminal to a connection point P5 between serially-connected resistors 104 and 105. The other end of the resistor 104 is connected to a reference power supply Vtt, while the other end of the resistor 105 is connected to the ground. The operational amplifier 102 is connected at an output terminal to an end of a resistor 106. The PD-S feedback circuit 100 is also provided with a variable resistor 103 connected at an end to a connection point P6 between the operational amplifier 102 and the photodiode 101 and at the other end to a connection point P7 between the operational amplifier 102 and the resistor 106. The resistor 106 is connected at the other end to a negative input terminal of another operational amplifier 107.

The operational amplifier 107 is connected at a positive input terminal to an end of a resistor 109, of which the other end is applied with the reference voltage Vtt. An output terminal of the operational amplifier 107 is connected to a resistor 110, which is serially connected to an end of a resistor 111. The other end of the resistor 111 is connected to the ground. The PD-S feedback circuit 100 is also provided with a resistor 108 connected at an end to a connection point P8 between the operational amplifier 107 and the resistor 106, and at the other end to a connection point P9 between the operational amplifier 107 and the resistor 110.

Figure 5:
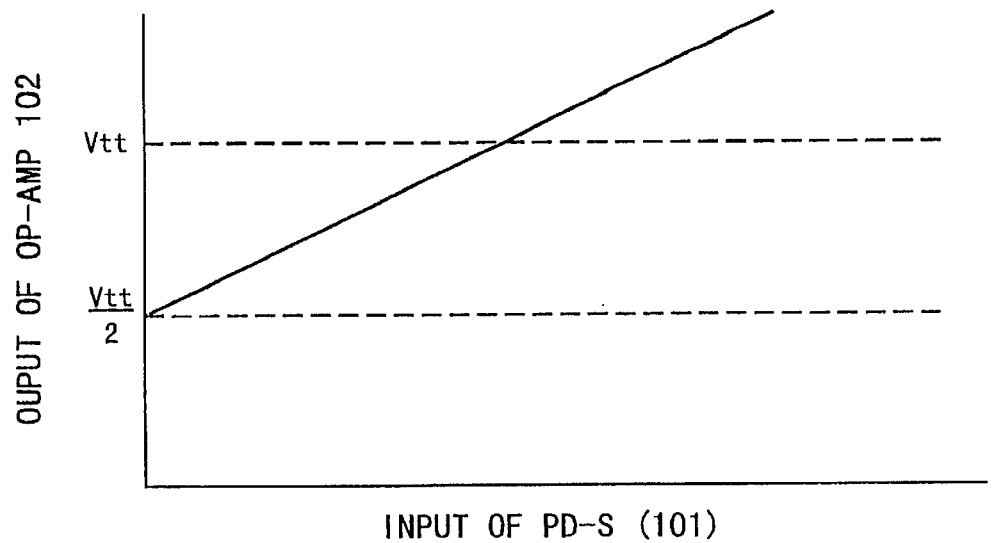
FIGS. 5 and 6 are graphs showing the operation of the PD-S feedback circuit, shown in FIG. 4.
Figure 6:
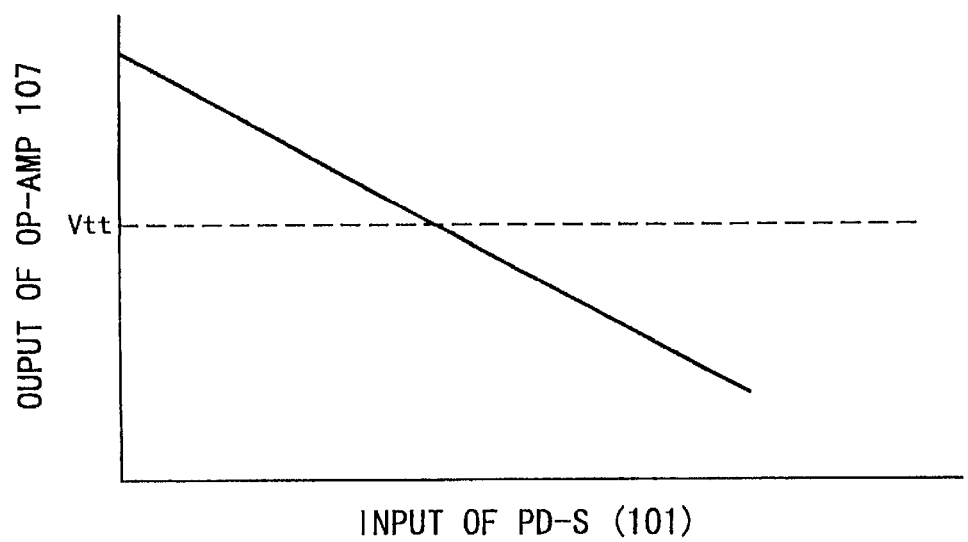

Next, the operation of the PD-S feedback circuit 100 will be described in conjunction with graphs shown in FIGS. 5 and 6. FIG. 5 shows level variation of the output of the operational amplifier 102 relative to powers of lights supplied to the photodiode 101, while FIG. 6 shows level variation of the output of the operational amplifier 107 relative to powers of lights supplied to the photodiode 101.

The photodiode 101 converts an input light ($P_{sig-mon}$) into a current signal to be amplified by the operational amplifier 102. In this case, when the power of light ($P_{sig-mon}$) supplied to the photodiode 101 is increased, the output of the operational amplifier 102 is increased as well. On the other hand, the output of the operational amplifier 107 is decreased, when the power of light ($P_{sig-mon}$) supplied to the photodiode 101 is increased.

Figure 7:
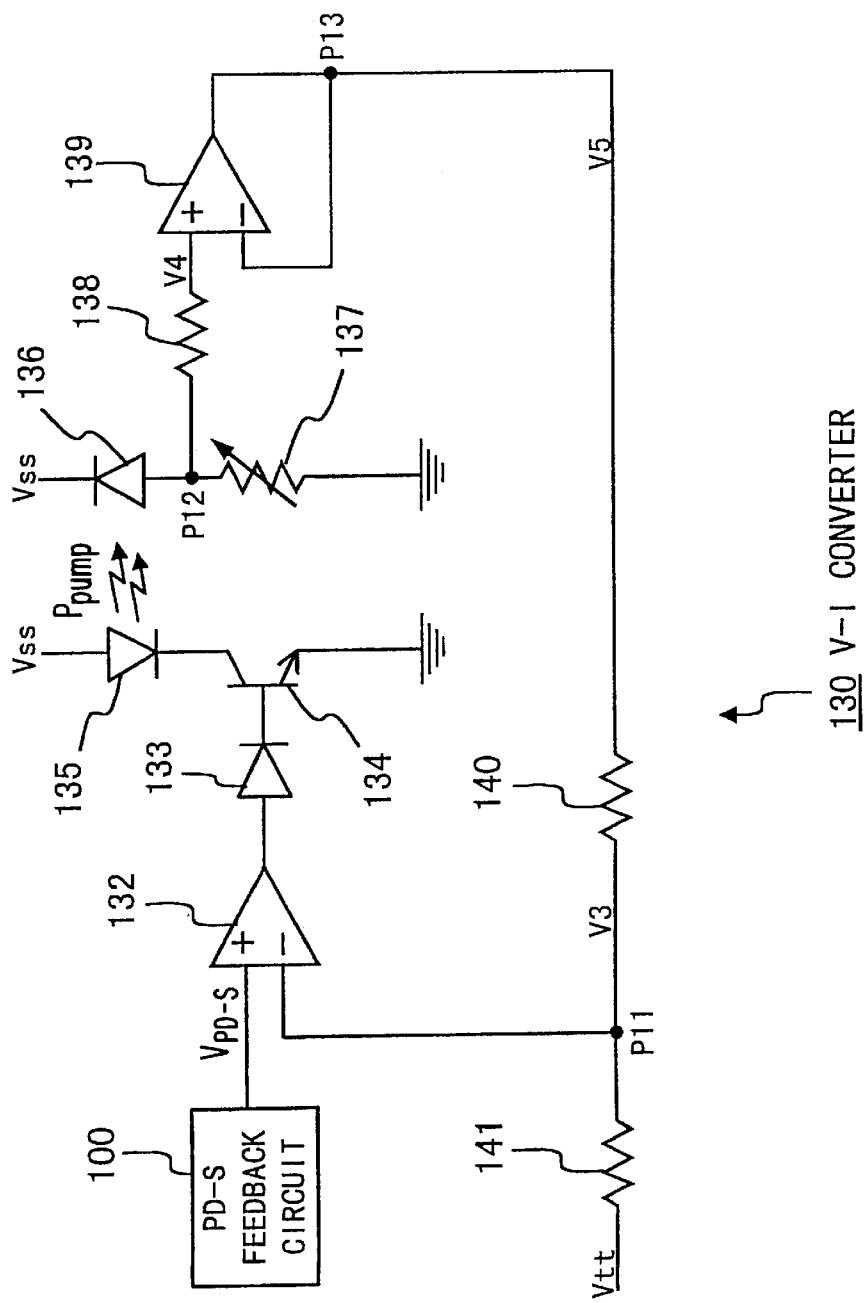
FIG. 7 is a circuit diagram illustrating a V-I converter used for controlling a laser diode in the optical amplifier, according to the first preferred embodiment of the invention.

FIG. 7 shows a V-I converter 130 used with the PD-S feedback circuit 100, shown in FIG. 4, in the optical amplifier according to the first preferred embodiment of the invention. The V-I converter 130 is designed to be used in place of the V-I converter 9, shown in FIG. 1. The V-I converter 130 includes an operational amplifier 132, which is connected at a positive input terminal to the PD-S feedback circuit 100. The operational amplifier 132 is connected at an output terminal to a cathode of a diode 133, of which an anode is connected to a base of a transistor 134. A signal supplied from the operational amplifier 132 is a kind of control signal that controls the quantity of current flowing through the laser diode 135.

The transistor 134 is connected at an emitter to the ground and at a collector to a cathode of a laser diode 135 (10). The laser diode 135 is designed to be used in place of the laser diode 10, shown in FIG. 1, for generating the excitation light $P_{pump}$. The laser diode 135 is connected at an anode to a power supply Vss. A negative input terminal of the operational amplifier 132 is connected to a connection point P11 between serially-connected resistors 140 and 141, so that a voltage V3 at the point P11 is applied to the negative input terminal. The other end of the resistor 141 is applied with a reference voltage Vtt.

The V-I converter 130 is provided with a back-monitor photodiode 136, which monitors an output light (excitation light $P_{pump}$) of the laser diode 135. The photodiode 136 is connected at a cathode to the power supply Vss and at an anode to a variable resistor 137, of which the other end is grounded. A resistor 138 is connected at an end to a connection point P12 between the photodiode 136 and the variable resistor 137. The other end of the resistor 138 is connected to a positive input terminal of a buffer operational amplifier 139. A negative input terminal and an output terminal of the buffer operational amplifier 139 are connected to the resistor 140.

In the V-I converter 130, when the voltage $V_{PD-S}$ from the PD-S feedback circuit 100 goes down in level, the output of the operational amplifier 132 goes down as well. When the output of the operational amplifier 132 goes down, the base-emitter voltage of the transistor 134 goes down, and the current flowing through the laser diode 135 is decreased. As a result, the excitation light $P_{pump}$ is decreased. The back-monitor photodiode 136 monitors the output light $P_{pump}$ of the laser diode 135, and converts the monitored light into a current signal. The variable resistor 137 converts the current signal into a voltage signal V4. When the output power of the laser diode 135 goes down, the voltage V4 goes down and the output of the buffer operational amplifier 139 goes down as well.

The resistors 140 and 141 divides a voltage V5 to provide a voltage V3 as follows: V3=(Vtt−V5)×R140/(R141+R140)+V5, where R140 and R141 are the resistance of the resistors 140 and 141, respectively. When the voltage V3 becomes identical to the voltage $V_{PD-S}$ supplied from the PD-S feedback circuit 100, the laser diode 135 becomes stable in operation. As a result, the output signal light $P_{sig-out}$ is controlled to get lower when it becomes too high, and is controlled to get higher when it becomes too low. Therefore, the output signal light $P_{sig-out}$ can keep being constant.

As described above, according to the first preferred embodiment, it is not required to use a resistor serially connected to the laser diode 135 for detecting electric current flowing through the laser diode 135. Instead, the back-monitor photodiode 136 is provided to monitor the output power of the laser diode 135, so that no voltage loss occurs there. Therefore, the laser diode 135 can be driven with low power consumption. In order to drive the laser diode 135 with 600 mA of current, for example, the forward current $V_f$ of the laser diode 135 is 2.2V, and the base-emitter voltage $V_{be}$ of the transistor 134 is 0.8V. Accordingly, 3.0V power is required in total. If a 3.3V power supply is employed, the minimum voltage would be 3.135V in consideration of voltage variation of ±5%. It means that the laser diode 135 can be driven even if the power supply has some voltage variation.

Figure 8A:
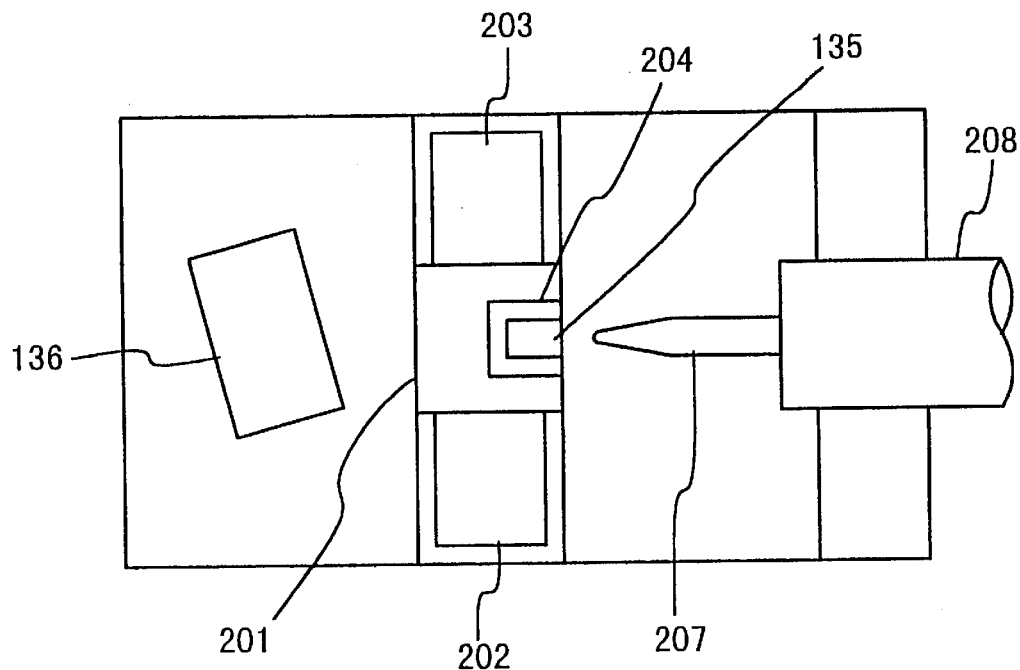
FIG. 8A is a plan view illustrating a laser module on which the laser diode of the first preferred embodiment is mounted.
Figure 8B:
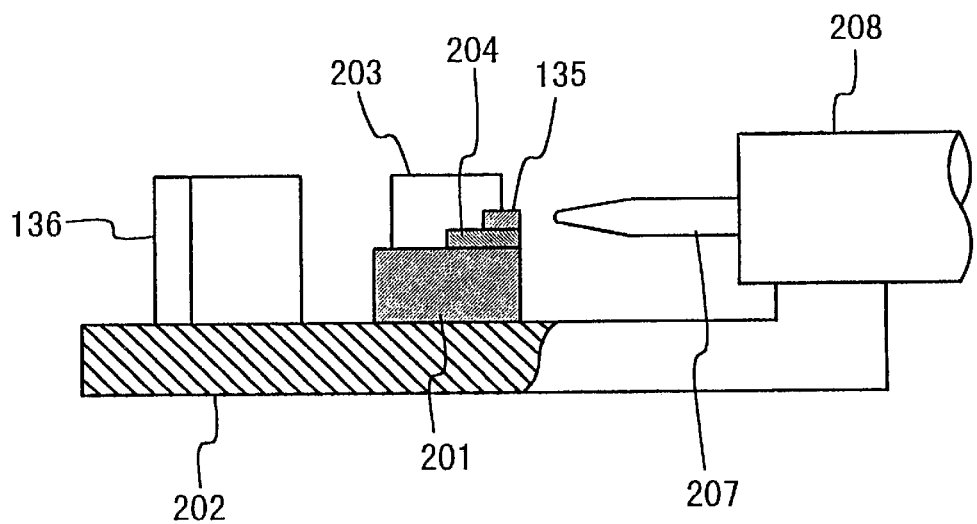
FIG. 8B is a side view (partially cross-sectioned) illustrating the laser module, shown in FIG. 8A.

FIGS. 8A and 8B show a laser module in which the laser diode 135 and the back-monitor photodiode 136 are mounted. In the laser module, the laser diode 135 is mounted on a sub-mount 204, which is placed on a heat sink 201. The back-monitor photodiode 136 is arranged behind the laser diode 135, and is angled not to receive a light ($P_{pump}$ directly from the laser diode 135 in order to prevent undesirable reflection of light. In front of the laser diode 135, an end of an optical fiber 207 is positioned. The optical fiber 207 is designed to be used in place of the optical fiber 10a, shown in FIG. 1. The optical fiber 207 is supported by a ferrule 208. The heat sink 201 and the back-monitor photodiode 136 are mounted on a substrate 202. A reference number 203 also represents a substrate.

Figure 9:
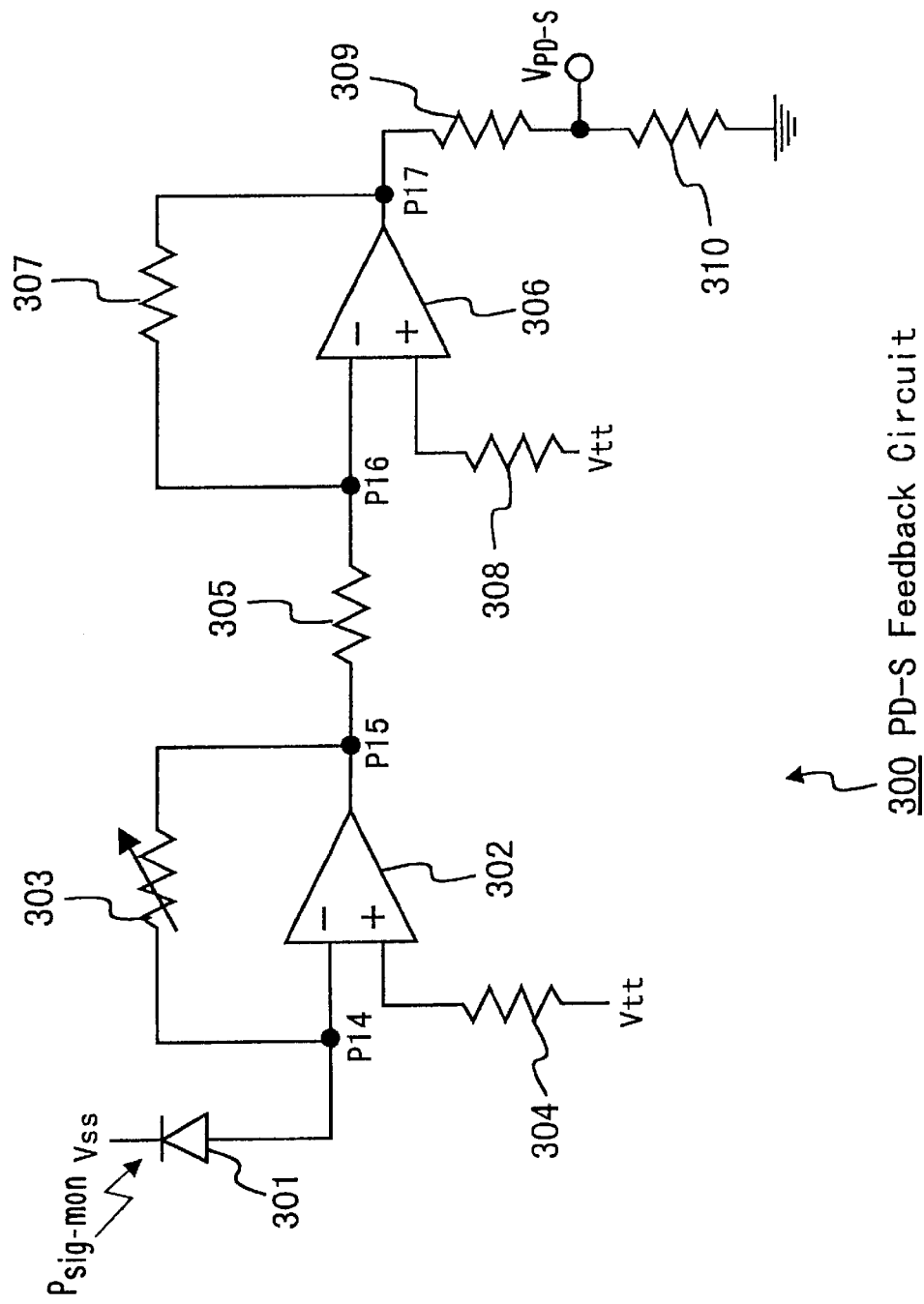
FIG. 9 is a circuit diagram illustrating a PD-S feedback circuit used in an optical amplifier according to a second preferred embodiment of the invention.

FIG. 9 shows a PD-S feedback circuit 300 used in an optical amplifier, according to a second preferred embodiment of the invention. The PD-S feedback circuit 300 is designed to be used in place of the above mentioned PD-S feedback circuit 8, shown in FIG. 1. The PD-S feedback circuit 300 includes an operational amplifier 302, connected at an negative input terminal to a cathode of a photodiode 301. The photodiode 301 is designed to be used in place of the photodiode 6, shown in FIG. 1.

An anode of the photodiode 301 is connected to a power supply Vss. A positive input terminal of the operational amplifier 302 is connected to an end of a resistor 304, of which the other end is applied with a reference voltage Vtt. An output terminal of the operational amplifier 302 is connected to a resistor 305. The PD-S feedback circuit 300 is also provided with a variable resistor 303 connected at an end to a connection point P14 between the operational amplifier 302 and the photodiode 301 and at the other end to a connection point P15 between the operational amplifier 302 and the resistor 305. The other end of the resistor 305 is connected to a negative input terminal of another operational amplifier 306.

The operational amplifier 306 is connected at a positive input terminal to an end of a resistor 308, of which the other end is applied with the reference voltage Vtt. An output terminal of the operational amplifier 306 is connected to a resistor 309, which is serially connected to a resistor 310. The other end of the resistor 310 is grounded. The PD-S feedback circuit 300 is also provided with a resistor 307 connected at an end to a connection point P16 between the operational amplifier 306 and the resistor 305, and at the other end to a connection point P17 between the operational amplifier 306 and the resistor 309.

Figure 10:
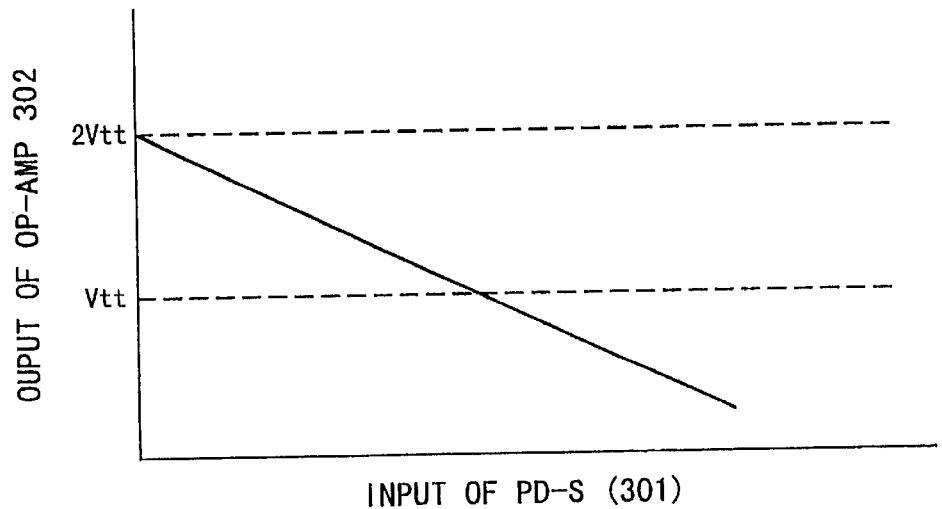
FIGS. 10 and 11 are, graphs showing the operation of the PD-S feedback circuit, shown in FIG. 9.
Figure 11:
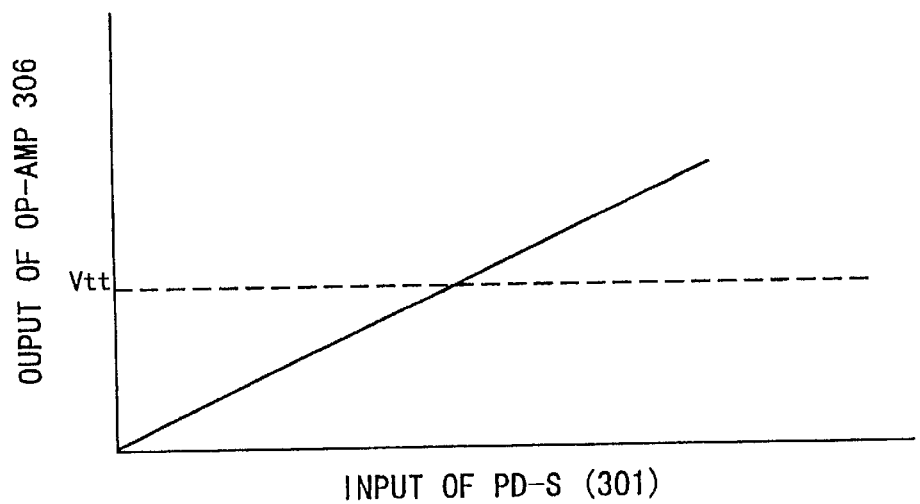

Next, the operation of the PD-S feedback circuit 300 will be described in conjunction with graphs shown in FIGS. 10 and 11. FIG. 10 shows level variation of the output of the operational amplifier 302 relative to powers of lights supplied to the photodiode 301. FIG. 11 shows level variation of the output of the operational amplifier 306 relative to powers of lights supplied to the photodiode 301.

The photodiode 301 converts an input light $P_{sig-mon}$ into a current signal to be amplified by the operational amplifier 302. In this case, when the power of light $P_{sig-mon}$ supplied to the photodiode 301 is increased, the output of the operational amplifier 302 is decreased in reverse. On the other hand, the output of the operational amplifier 306 is increased, when the power of light $P_{sig-mon}$ supplied to the photodiode 301 is increased.

Figure 12:
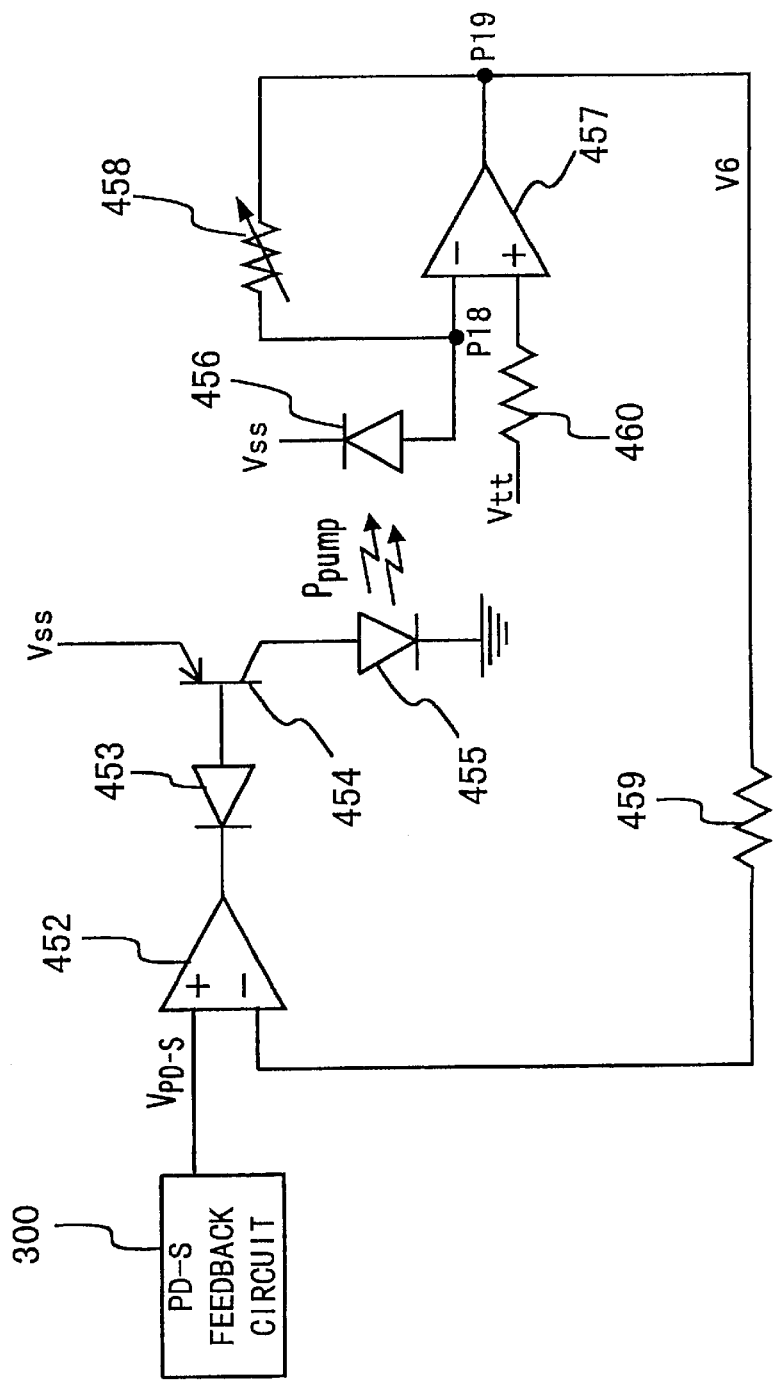
FIG. 12 is a circuit diagram illustrating a V-I converter used for controlling a laser diode in the optical amplifier, according to the second preferred embodiment of the invention.

FIG. 12 shows a V-I converter 400 used with the PD-S feedback circuit 300, shown in FIG. 9, in the optical amplifier according to the second preferred embodiment of the invention. The V-I converter 400 is designed to be used in place of the V-I converter 9, shown in FIG. 1. The V-I converter 400 includes an operational amplifier 452, which connected at a positive input terminal to the PD-S feedback circuit 300. An output terminal of the operational amplifier 452 is connected to a cathode of a diode 453, of which an anode is connected to a base of a transistor 454.

The transistor 454 is connected at an emitter to the power supply Vss and at a collector to an anode of a laser diode 455 (10), which supplies the excitation light $P_{pump}$. The laser diode 455 is designed to be used in place of the laser diode 10, shown in FIG. 1. The laser diode 455 is connected at a cathode to the ground. A negative input terminal of the operational amplifier 452 is connected to an end of a resistor 459.

The V-I converter 400 is provided with a back-monitor photodiode 456, which monitors an output light (excitation light $P_{pump}$) of the laser diode 455. The photodiode 456 is connected at a cathode to the power supply Vss and at an anode to a negative input terminal of another operational amplifier 457. The operational amplifier 457 is connected at a positive input terminal to an end of a resistor 460, of which the other end is applied with the reference voltage Vtt. A variable resistor 458 is connected at an end to a connection point P18 between the diode 456 and the positive input terminal of the operational amplifier 457, and at the other end to the other end of the resistor 459. An output terminal of the operational amplifier 457 is connected to a connection point P19 between the variable resistor 458 and the resistor 459.

In the V-I converter 400, when the voltage $V_{PD-S}$ from the PD-S feedback circuit 300 goes up, the output of the operational amplifier 452 goes up as well. When the output of the operational amplifier 452 goes up, the base-emitter voltage of the transistor 454 goes down in reverse, and the current flowing through the laser diode 455 is decreased. As a result, the excitation light $P_{pump}$ is decreased. The back-monitor photodiode 456 monitors the output light $P_{pump}$ of the laser diode 455, and converts the monitored light into a current signal. The variable resistor 458 converts the current signal into a voltage signal V6. When the output power of the laser diode 455 goes down, the voltage V6 goes up in reverse. When the voltage V6 becomes identical to the voltage $V_{PD-S}$ from the PD-S feedback circuit 300, the laser diode 455 becomes stable in operation. As a result, the output signal light $P_{sig-out}$ of the optical amplifier is controlled to get lower when it becomes too high, and is controlled to get higher when it becomes too low. Therefore, the output signal light $P_{sig-out}$ can keep being constant.

As described above, according to the second preferred embodiment, the same advantages as the first preferred embodiment can be obtained. That is, the laser diode 455 can be driven with low power consumption. In addition, even if the laser diode (455) is grounded at the cathode, the monitored voltage V6 is not changed in level in response to variation of the power supply Vss. Therefore, the current flowing through the laser diode 455 can be controlled precisely.

Figure 13:
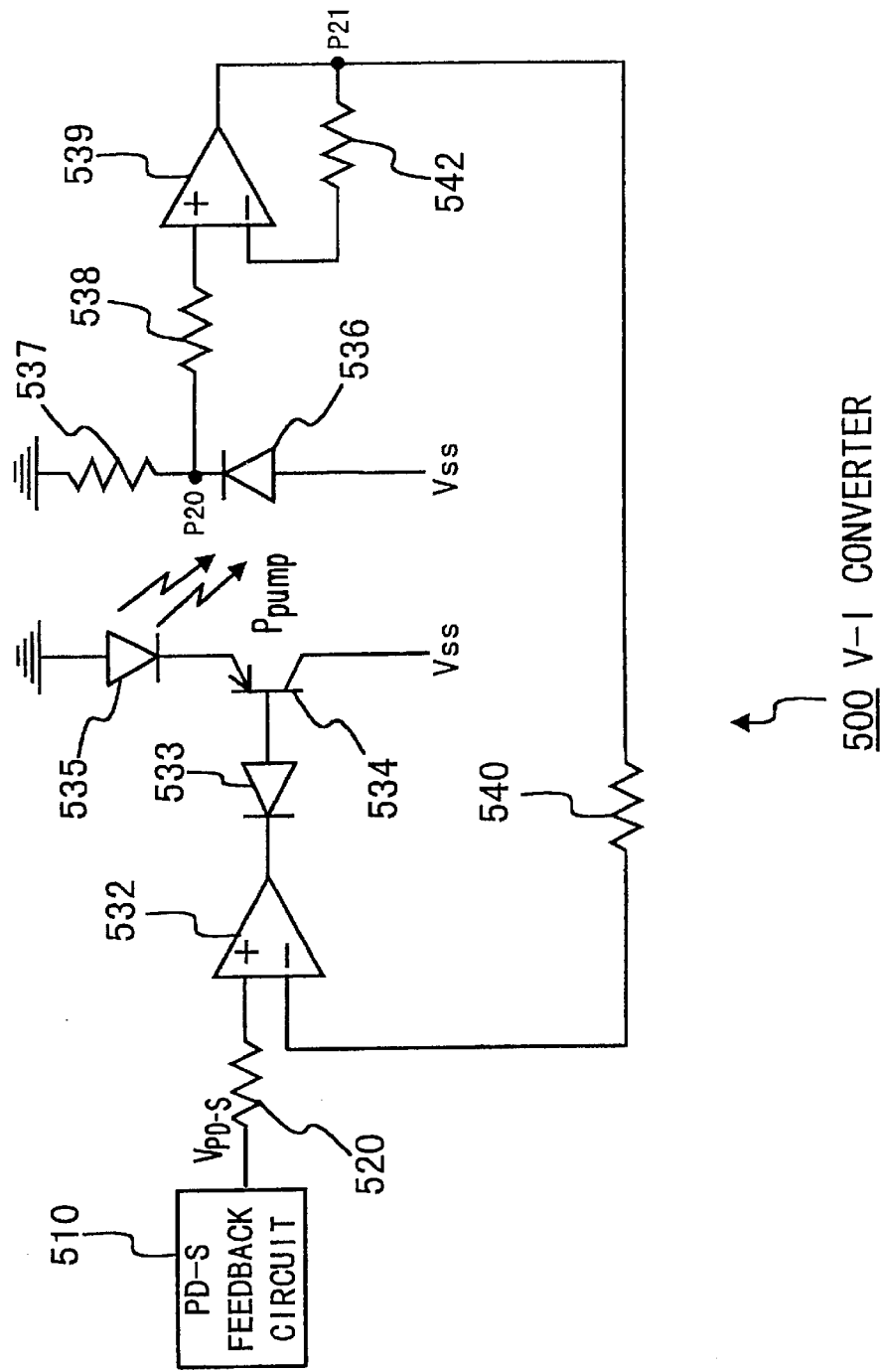
FIG. 13 is a circuit diagram illustrating a V-I converter used for controlling a laser diode in an optical amplifier, according to a third preferred embodiment of the invention.

FIG. 13 shows a V-I converter 500 used in an optical amplifier according to a third preferred embodiment of the invention. The V-I converter 500 is designed to be used in place of the V-I converter 9, shown in FIG. 1. The V-I converter 500 includes an operational amplifier 532, which connected at a positive input terminal to a PD-S feedback circuit 510 through a resistor 520. The operational amplifier 532 is connected at an output terminal to a cathode of a diode 533, of which an anode is connected to a base of a transistor 534. The transistor 534 is connected at an emitter to a cathode of a laser diode 535 and at a collector to a power supply Vss. The laser diode 535 is designed to be used in place of the laser diode 10, shown in FIG. 1. An anode of the laser diode 535 is connected to the ground. The operational amplifier 532 is connected at a negative input terminal to an end of a resistor 540.

The V-I converter 500 is provided with a back-monitor photodiode 536, which monitors an output light (excitation light $P_{pump}$) of the laser diode 535. The photodiode 536 is connected at an anode to the power supply Vss and at a cathode to an end of a resistor 537, of which the other end is grounded. A resistor 538 is connected at an end to a connection point P20 between the photodiode 536 and the resistor 537. The other end of the resistor 538 is connected to a positive input terminal of a buffer operational amplifier 539. A negative input terminal and an output terminal of the buffer operational amplifier 539 are connected to the other end of the resistor 540.

As described above, according to the third preferred embodiment, the same advantages as the first and second preferred embodiments can be obtained. That is, the laser diode 535 can be driven with low power consumption. In addition, even if the laser diode (535) is grounded at the anode, the monitored voltage is not changed in level in response to variation of the power supply Vss. Therefore, the current flowing through the laser diode 535 can be controlled precisely.

It will be understood that the above description of the present invention is susceptible to various modifications, changes and adaptations, and the same are intended to be comprehended with the meaning and range of equivalents of the appended claims.

What is claimed is:

1. An apparatus for controlling a laser diode, comprising:
   a photodiode which monitors an output light of the laser diode;
   a control signal generator which generates a control signal in response to an output of the photodiode; and
   a driver circuit which drives the laser diode in response to the control signal so that the laser diode generates an optimum power of light.

2. The apparatus, according to claim 1, further comprising:
   a transistor which serially connected to the laser diode to drive the laser diode.

3. The apparatus, according to claim 2, wherein
   the transistor is connected at a base to an output terminal of the control signal generator, at a collector to a cathode of the laser diode and at an emitter to the ground; and
   the laser diode is connected at an anode to a power supply.

4. The apparatus, according to claim 3, further comprising:
   a variable resistor connected at an end to the ground and at the other end to an anode of the photodiode, wherein
   a cathode of the photodiode is connected to the power supply.

5. The apparatus, according to claim 2, wherein
   the transistor is connected at a base to an output terminal of the control signal generator, at a collector to an anode of the laser diode and at an emitter to a power supply; and
   the laser diode is connected at a cathode to the ground.

6. The apparatus, according to claim 5, wherein
   the photodiode is connected at a cathode to the power supply.

7. The apparatus, according to claim 2, wherein
   the transistor is connected at a base to an output terminal of the control signal generator, at an emitter to a cathode of the laser diode and at a collector to a power supply; and
   the laser diode is grounded at an anode.

8. The apparatus, according to claim 7, further comprising:
   a resistor connected at an end to the ground and at the other end to a cathode of the photodiode, wherein
   an anode of the photodiode is connected to the power supply.

9. A laser module, comprising:
   a laser diode which generates a light to be coupled to an optical fiber;
   a photodiode which monitors the light outputted from the laser diode; and
   a control signal generator which generates a control signal in response to an output of the photodiode, wherein
   the laser diode is controlled in response to the control signal to generate an optimum power of light.

10. The laser module, according to claim 9, further comprising:
    a transistor which serially connected to the laser diode to drive the laser diode.

11. The laser module, according to claim 10, wherein
    the transistor is connected at a base to an output terminal of the control signal generator, at a collector to a cathode of the laser diode and at an emitter to the ground; and
    the laser diode is connected at an anode to a power supply.

12. The laser module, according to claim 11, further comprising:
    a variable resistor connected at an end to the ground and at the other end to an anode of the photodiode, wherein
    a cathode of the photodiode is connected to the power supply.

13. The laser module, according to claim 10, wherein
    the transistor is connected at a base to an output terminal of the control signal generator, at a collector to an anode of the laser diode and at an emitter to a power supply; and
    the laser diode is connected at a cathode to the ground.

14. The laser module, according to claim 13, wherein
    the photodiode is connected at a cathode to the power supply.

15. The laser module, according to claim 10, wherein
    the transistor is connected at a base to an output terminal of the control signal generator, at an emitter to a cathode of the laser diode and at a collector to a power supply; and
    the laser diode is grounded at an anode.

16. The laser module, according to claim 15, further comprising:
    a resistor connected at an end to the ground and at the other end to a cathode of the photodiode, wherein
    an anode of the photodiode is connected to the power supply.

17. An apparatus for amplifying a signal light, comprising:
    an optical amplifier which amplifies an input light to generate an output light;
    a laser diode which generates an excitation light to be combined with the input light to excite the optical amplifier;
    a photodiode which monitors the excitation light outputted from the laser diode;
    a control signal generator which generates a control signal in response to an output of the photodiode; and
    a driver circuit which drives the laser diode in response to the control signal so that the laser diode generates an optimum power of excitation light.

18. The apparatus, according to claim 17, further comprising:
    a transistor which serially connected to the laser diode to drive the laser diode.

19. The apparatus, according to claim 18, wherein
    the transistor is connected at a base to an output terminal of the control signal generator, at a collector to a cathode of the laser diode and at an emitter to the ground; and
    the laser diode is connected at an anode to a power supply.

20. The apparatus, according to claim 19, further comprising:
    a variable resistor connected at an end to the ground and at the other end to an anode of the photodiode, wherein
    a cathode of the photodiode is connected to the power supply.

21. The apparatus, according to claim 18, wherein
    the transistor is connected at a base to an output terminal of the control signal generator, at a collector to an anode of the laser diode and at an emitter to a power supply; and
    the laser diode is connected at a cathode to the ground.

22. The apparatus, according to claim 21, wherein
the photodiode is connected at a cathode to the power supply.

23. The apparatus, according to claim 18, wherein
the transistor is connected at a base to an output terminal of the control signal generator, at an emitter to a cathode of the laser diode and at a collector to a power supply; and
the laser diode is grounded at an anode.

24. The apparatus, according to claim 23, further comprising:
a resistor connected at an end to the ground and at the other end to a cathode of the photodiode, wherein
an anode of the photodiode is connected to the power supply.

* * * * *